United States Patent [19]
Yamamoto et al.

[11] Patent Number: 5,404,309
[45] Date of Patent: Apr. 4, 1995

[54] CAD APPARATUS FOR DESIGNING PATTERN OF ELECTRIC CIRCUIT

[75] Inventors: Hirohisa Yamamoto, Nabari; Toshiaki Nagakawa, Higashi-Osaka; Takuji Kurimoto, Shiki, all of Japan

[73] Assignee: Sharp Kabushiki Kaisha, Osaka, Japan

[21] Appl. No.: 830,424

[22] Filed: Jan. 31, 1992

[30] Foreign Application Priority Data

Feb. 4, 1991 [JP] Japan .................................. 3-013250

[51] Int. Cl.$^6$ ................................................. G06F 17/50
[52] U.S. Cl. ........................................ 364/489; 364/488
[58] Field of Search ........................ 364/488, 489, 490

[56] References Cited

U.S. PATENT DOCUMENTS

| 4,891,242 | 1/1990 | Ito et al. | 427/53.1 |
| 5,064,711 | 11/1991 | Ito et al. | 428/209 |

FOREIGN PATENT DOCUMENTS

| 53-50470 | 5/1978 | Japan . |
| 53-51478 | 5/1978 | Japan . |
| 62-195193 | 8/1987 | Japan . |
| 5472 | 1/1988 | Japan . |
| 247576 | 9/1992 | Japan . |

OTHER PUBLICATIONS

Proceedings 5th International Microelectronics Conference, Aug. 25, 1988, Tokyo JP pp. 558–563 (Ventham, et al).
Electronic Design, Mar. 7, 1985 pp. 115–122 (Miller).

*Primary Examiner*—Vincent N. Trans
*Attorney, Agent, or Firm*—David G. Conlin; Kevin J. Fournier

[57] ABSTRACT

A CAD apparatus for designing a pattern of an electric circuit, is provided with: a printed resistor shape parameter storing unit for storing values of printed resistor shape parameters including a maximum aspect ratio and a minimum aspect ratio of a printed resistor, which pattern is to be designed; a resistor parameter storing unit for storing values of resistor parameters including a necessary resistance of the printed resistor; a resistor material table storing unit for storing a resistor material table including names of various resistor materials and resistances per unit area of the various resistor materials correspondingly; and an optimum resistor material name storing unit for storing an optimum resistor material name of the printed resistor. The CAD apparatus is also provided with an optimum resistor material selecting unit for calculating aspect ratios of the various resistor materials according to a predetermined rule based on the resistances of the various resistor materials and the necessary resistance, selecting the optimum resistor material according to a predetermined rule based on the values of the calculated aspect ratios and the values of the maximum and minimum aspect ratios, and storing the name of the selected optimum resistor material into the optimum resistor material name storing unit.

4 Claims, 5 Drawing Sheets

| RESISTOR MATERIAL NAME | SHEET RESISTANCE | PERMITTED ELECTRIC POWER VALUE |
|---|---|---|
| A | $Rs_a$ | $Rp_a$ |
| B | $Rs_b$ | $Rp_b$ |
| --- | --- | --- |
| N | $Rs_n$ | $Rp_n$ |

Fig. 4

RESISTOR MATERIAL NAME $\underline{N}$

MEASURED DATA NUMBER $\underline{m}$

EFFECTIVE RESISTOR LENGTH
$L_1$
$L_2$
---
$L_n$
---
$L_m$

NOMINAL SHEET RESISTANCE $Rsn$

EFFECTIVE RESISTOR WIDTH $Wn$

OBSERVATION SHEET RESISTANCE
$Ros_1$
$Ros_2$
$Ros_n$
$Ros_m$

PERMITTED ELECTRIC POWER VALUE $Ppn$

ELECTRODE MATERIAL NAME $\underline{X}$

Fig. 5

CAD APPARATUS FOR DESIGNING PATTERN OF ELECTRIC CIRCUIT

BACKGROUND OF THE INVENTION

1. Field of the Invention

The present invention relates to a so-called CAD (Computer Aided Design) apparatus for designing a pattern of an electric circuit such as a pattern of a printed circuit board, a pattern of a hybrid IC (Integrated Circuit), etc., which is utilized to aid a designer to perform the designing operation of such patterns.

2. Description of the Related Arts

When the designer performs this kind of designing operation of the printed circuit board and the hybrid IC, the CAD apparatus by use of a computer, may be preferably utilized.

In the designing operations by use of such a CAD apparatus, the designer is supposed to directly obtain the design as for the selection of a material for a resistor (which will be referred as a "resistor material", hereinbelow) to be printed on a substrate etc. (which will be referred as "printed resistor", hereinbelow), as for the pattern shape of the printed resistor, and as for the pattern shape of an electrode for the printed resistor.

For example, the inventors of the present invention know one selecting method of such a resistor material, as following.

Namely, at first, the value of an aspect ratio As for each resistor material is calculated by the following expression (1), by use of a resistance R necessary for the printed resistor to be designed (which will be referred as a "necessary resistance" R) and a resistance Rs per unit area of various types of resistor materials to be used (which will be referred as a "sheet resistance" Rs).

$$As = R/Rs \quad (1)$$

Then, the resistor material, which aspect ratio As calculated by the expression (1) is closest to "1", is selected as the most preferable resistor material.

On the other hand, the pattern shape of the printed resistor is obtained as following.

Figure 1:
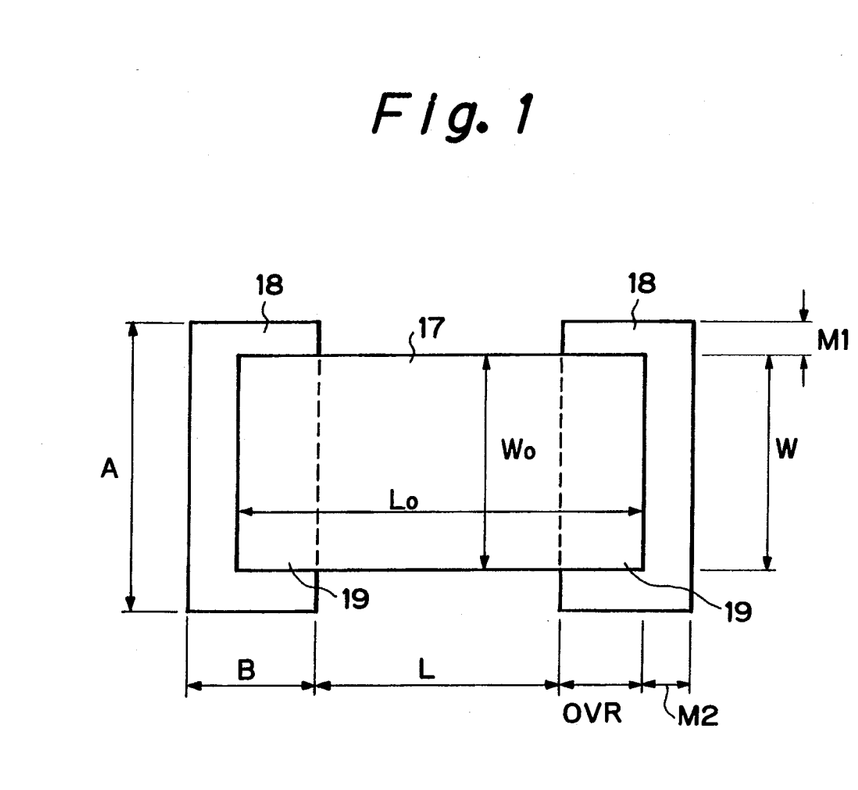
FIG. 1 is a schematic plan view of one example of pattern shape of a printed resistor.

Here, as shown in FIG. 1, it is assumed that the shape of a printed resistor 17 is a basic type of a simple square plane shape, and that the printed resistor 17 is printed with each end thereof overlapped with each electrode 18 formed on the substrate.

At first, the value of a necessary minimum area Smn of the printed resistor 17 is calculated by the following expression (2), by use of an electric power Pp when the unit area of the resistor material selected by the above-mentioned manner is destroyed (which will be referred as a "permitted power" Pp, hereinbelow), an electric consumption power P of the printed resistor 17 to be designed (which will be referred as a "resistor consuming power" P), and a coefficient ft based on a trimming technique by the designer, which is basically obtained by his experiences.

$$Smn = ft \times P/Pp \quad (2)$$

Next, the values of an effective resistor width W and an effective resistor length L, are calculated by the following expressions (3) and (4), by use of the values of the aspect ratio As calculated by the expression (1) and the value of the necessary minimum area Smn calculated by the expression (2).

$$W = (Smn/As)^{\frac{1}{2}} \quad (3)$$

$$L = As \times W \quad (4)$$

Then, the pattern shape of the printed resistor 17 i.e. the value W of a printed resistor width W0 and the value "L+OVR×2" of a printed resistor length L0, and the pattern shape of the electrode 18 i.e. the value "OVR+M2" of an electrode width B, and the value "W+M1×2" of an electrode length A, are determined on the basis of the values of the pattern shape of the printed resistor 17 i.e. the effective resistor width W and the effective resistor length L calculated by use of the expressions (1) to (4).

In this manner, the selection of the resistor material, and the determination of the pattern shapes of the printed resistor 17 and the electrode 18 corresponding to the selected resistor material, can be performed.

However, the printed resistor 17, which pattern shape is set according to the values of the resistor shape data (the effective resistor width W and the effective resistor length L) calculated by use of the above-mentioned expressions (1) to (4), is actually subjected to the generation of some contact resistance at the overlapped portion 19 between the printed resistor 17 and the electrode 18, and also the generation of the printing blot at both ends of the printed resistor 17. Accordingly, there is a problem that an appropriate necessary resistance R cannot be in fact obtained according to the above mentioned design technique.

Thus, the designer may try to give some correction to the effective resistor width W and the effective resistor length L, which are calculated by use of the expressions (1) to (4), depending on his experience, so that an appropriate or tolerable pattern shapes of the printed resistor 17 and the electrode 18, can be determined as a final result of the designing operation.

In this way, according to the above explained CAD apparatus for designing the pattern of the electric circuit such as a printed substrate and a hybrid IC, the pattern shapes of the printed resistor and the electrode can be finally determined with the necessity of the experienced designer, so that the quality of the resultant pattern shapes depends on the skill of the designer in a great degree, and the objectively appropriate design can be merely obtained.

SUMMARY OF THE INVENTION

It is therefore an object of the present invention to provide a CAD apparatus for designing a pattern of an electric circuit, which can improve the efficiency, the objectiveness and the accuracy of the pattern determining process of the printed resistor in the pattern designing operation.

According to the present invention, the above mentioned object can be achieved by a CAD apparatus for designing a pattern of an electric circuit. The CAD apparatus is provided with: a printed resistor shape parameter storing unit for storing values of printed resistor shape parameters including a maximum aspect ratio and a minimum aspect ratio of a printed resistor, which pattern is to be designed; a resistor parameter storing unit for storing values of resistor parameters including a necessary resistance of the printed resistor; a resistor material table storing unit for storing a resistor material table including names of various resistor materials and resistances per unit area of the various resistor materials correspondingly; and an optimum resistor material name storing unit for storing an optimum resistor material name of the printed resistor. The CAD apparatus is also provided with an optimum resistor material selecting unit for calculating aspect ratios of the various resistor materials according to a predetermined rule based on the resistances of the various resistor materials and the necessary resistance, selecting the optimum resistor material according to a predetermined rule based on the values of the calculated aspect ratios and the values of the maximum and minimum aspect ratios, and storing the name of the selected optimum resistor material into the optimum resistor material name storing unit.

In the CAD apparatus of the present invention, the aspect ratio of each resistor material is calculated by the selecting unit, according to the predetermined rule based on the resistances per unit area of various resistor materials in the resistor material table, and the necessary resistance stored in the resistor parameter storing unit. Further, the optimum resistor material is selected by the selecting unit, according to the predetermined rule based on the values of thus calculated aspect ratios and the values of the maximum and minimum aspect ratios, which are stored in the printed resistor shape parameter storing unit. Then, the name of thus selected resistor material is stored into the optimum resistor material name storing unit.

Consequently, the optimum resistor material of the printed resistor to be designed, can be easily and automatically selected by the CAD apparatus of the present invention.

In one aspect i.e. a second aspect of the present invention, the printed resistor shape parameters further include a trimming ratio, which indicates the ratio of a width, which can be trimmed, of the printed resistor with respect to an effective width of the printed resistor, and a calculation resistance ratio, which is a coefficient to make an estimation of the necessary resistance of the printed resistor lower in consideration of a proceeding trimming process, in advance. The resistor parameters further include a resistor consuming electric power, which indicates a consuming electric power of the printed resistor. The resistor material table further includes a permitted electric power per unit area of each of the various resistor materials correspondingly. Here, the CAD apparatus is also provided with: a resistor shape storing unit for storing a resistor shape including an effective resistor width and an effective resistor length of the printed resistor. The CAD apparatus is further provided with a calculating unit for calculating a necessary minimum area of the printed resistor using the optimum resistor material according to a predetermined rule based on the values of the permitted electric power, the resistor consuming electric power and the trimming ratio of the selected optimum resistor material, calculating an aspect ratio of the printed resistor using the optimum resistor material before a trimming operation, according to a predetermined rule based on the necessary resistance, the resistance per unit area of the optimum resistor material and the value of the calculation resistance ratio, calculating the resistor shape of the printed resistor using the optimum resistor material, according to a predetermined rule based on the value of the calculated necessary minimum area and the value of the calculated aspect ratio before trimming, and storing the value of the calculated resistor shape into the resistor shape storing unit.

According to the second aspect of the present invention, the necessary minimum area of the printed resistor using the optimum resistor material, which is selected by the selecting unit and stored in the optimum resistor material name storing unit, is calculated by the calculating unit, according to the predetermined rule based on the value of the permitted electric power per unit area in the resistor material table, which is related to the selected optimum resistor material, the value of the resistor consuming electric power, which is stored in the resistor parameter storing unit, and the value of the trimming ratio, which is stored in the printed resistor shape parameter storing unit. Further, the aspect ratio of the printed resistor using the optimum resistor material before the trimming operation, is calculated by the calculating unit, according to the predetermined rule based on the necessary resistance, the resistance per unit area of the optimum resistor material, and the value of the calculation resistance ratio, which is stored in the printed resistor shape parameter storing unit. After these calculations, the resistor shape, which consists of the effective resistor width and length of the printed resistor using the optimum resistor material, is calculated by the calculating unit, according to the predetermined rule based on the value of the calculated necessary minimum area, and the value of the calculated aspect ratio before the trimming operation. Then, thus calculated values of the resistor shape are stored into the resistor shape storing unit.

Consequently, in addition to the automatic selection of the optimum resistor material, the resistor shape of the printed resistor using this selected optimum resistor material, can be calculated easily and automatically by the CAD apparatus according to the second aspect of the present invention.

In a third aspect of the present invention, in addition to the above explained feature in the second aspect of the present invention, the printed resistor shape parameters further include a used electrode material name, which indicates a name of material of an electrode for the printed resistor, which pattern is also to be designed. Here, the CAD apparatus is also provided with an observation resistance table storing unit for storing an observation resistance table including an observation resistance per unit area corresponding to a changing value of one of the effective resistor width and the effective resistor length, for each set of the resistor material name and the used electrode material name, respectively. The CAD apparatus is further provided with a resistor shape correcting unit for obtaining a characteristic curve of the observation resistance per unit area, under the condition that the other of the effective resistor width and the effective resistor length is set to be a constant value, according to a predetermined rule based on the observation resistance table related to the set of the optimum resistor material and the used electrode material name, correcting the effective resistor width or the effective resistor length, according to a predetermined rule based on the characteristic curve, the necessary resistance and the value of the calculated resistor shape, and renewing the content of the resistor shape storing unit.

According to the third aspect of the present invention, the observation resistance table is read out from the observation resistance table storing unit, which is related to the set of the optimum resistor material selected by the selecting unit, and the used electrode material name, which is stored in the printed resistor shape parameter storing unit. Then, the characteristic curve of the observation resistance per unit area under the condition that either one of the effective resistor width and the effective resistor length is set to be a constant value, is obtained by the correcting unit according to the predetermined rule based on this read out observation resistor table. Further, either the effective resistor width or the effective resistor length is corrected by the correcting unit, according to the predetermined rule based on this obtained characteristic curve, the necessary resistance, and the values of the resistor shape, which are -calculated by the calculating unit. Finally, the content of the resistor shape storing unit is renewed by thus corrected effective resistor width or length.

Consequently, in addition to the automatic selection of the optimum resistor material, and the automatic calculation of the resistor shape of the printed resistor, the calculated resistor shape can be corrected easily and automatically, so as to more precisely harmonize it with the actual shape of the printed resistor, by the CAD apparatus according to the third aspect of the present invention.

In a fourth aspect of the present invention, in addition to the above explained feature in the third aspect of the present invention, the printed resistor shape parameters further include an overlapped width, which indicates the width of an overlapped portion between the printed resistor and the electrode to be designed, and an electrode shape, which indicates a shape of the electrode. Here, the CAD apparatus is further provided with a determining unit for determining a printed resistor pattern shape, which includes a printed resistor width and a printed resistor length, and an electrode pattern shape, which includes an electrode width and an electrode length, according to a predetermined rule based on the value of the resistor shape, the value of the overlapped width and the value of the electrode shape.

According to the fourth aspect of the present invention, the printed resistor pattern shape, which consists of the printed resistor width and the printed resistor length, and the electrode pattern shape, which consists of the electrode width and the electrode length, can be determined by the determining unit, according to the predetermined rule based on the value of the resistor shape, which is calculated by the calculating unit, or the value of the corrected resistor shape, which is corrected by the correcting unit, and the values of the printed resistor/electrode overlapped width and the electrode shape, which are stored in the printed resistor shape parameter storing unit.

Consequently, in addition to the automatic selection of the optimum resistor material, the automatic calculation of the resistor shape of the printed resistor, and the automatic correction of the resistor shape of the printed resistor, the determinations of the printed resistor pattern shape and the electrode pattern shape, can be performed easily and automatically, by the CAD apparatus according to the fourth aspect of the present invention.

In a fifth aspect of the present invention, in addition to the above explained feature in the fourth aspect of the present invention, the CAD apparatus is provided with: a displaying unit for displaying the printed resistor pattern shape and the electrode pattern shape, which are determined by the determining unit; and an inputting unit for inputting an evaluation result of the displayed printed resistor pattern shape and the displayed electrode pattern shape, and further inputting at least one of new values of the printed resistor shape parameter and the resistor shape, and a new name of the optimum resistor material name, if the evaluation result is negative. The CAD apparatus is further provided with a renewing unit for renewing the content of the printed resistor shape parameter storing unit, the resistor shape storing unit or the optimum resistor material name storing unit, if the new value or the new name is inputted via the inputting unit, wherein at least one of the optimum resistor material selecting operation, the resistor shape calculating operation, the resistor shape correcting operation, and the printed resistor pattern shape determining operation, is performed again, by the selecting unit, the calculating unit, the correcting unit, and the determining unit, on the basis of the contents of the printed resistor shape parameter storing unit, the optimum resistor material name storing unit and the resistor shape storing unit, which are renewed by the renewing unit, if the new value or the new name is inputted.

According to the fifth aspect of the present invention, the printed resistor pattern shape using the optimum resistor material and the electrode pattern shape, which are determined by the determining unit, are displayed by the displaying unit, so that the designer can visually check and evaluate these determined pattern shapes. Then, the evaluation result is inputted via the inputting unit, by the designer. In addition, if the evaluation result is negative, i.e. if the designer is not satisfied with these displayed pattern shapes, at least one of the new values of the printed resistor shape parameter and the resistor shape, and the new name of the optimum resistor material, is inputted via the inputting unit by the designer. Then, the content of the printed resistor shape parameter storing unit, the resistor shape storing unit or the optimum resistor material name storing unit, is renewed with this newly inputted values or name correspondingly, by the renewing unit. Then, the optimum resistor material selecting operation, the resistor shape calculating operation, the resistor shape correcting operation, and the printed resistor pattern shape determining operation, depending on the newly inputted values and name, are performed again, on the basis of this renewed content, by the selecting unit, the calculating unit, the correcting unit and the determining unit.

Consequently, in addition to the automatic selection of the optimum resistor material, the automatic calculation of the resistor shape of the printed resistor, the automatic correction of the resistor shape of the printed resistor, and the automatic determinations of the printed resistor pattern shape and the electrode pattern shape, the redetermination of these printed resistor pattern shape and electrode pattern shape, can be performed easily and automatically, just by inputting the new value of the printed resistor shape parameter or the resistor shape, or the new name of the optimum resistor material via the inputting unit, if the evaluation result is negative.

Further objects and advantages of the present invention will be apparent from the following description of the preferred embodiment of the invention as illustrated in the accompanying drawings.

DETAILED DESCRIPTION OF THE PREFERRED EMBODIMENT

A preferred embodiment of the present invention will be described below with reference to the accompanying drawings.

Figure 2:
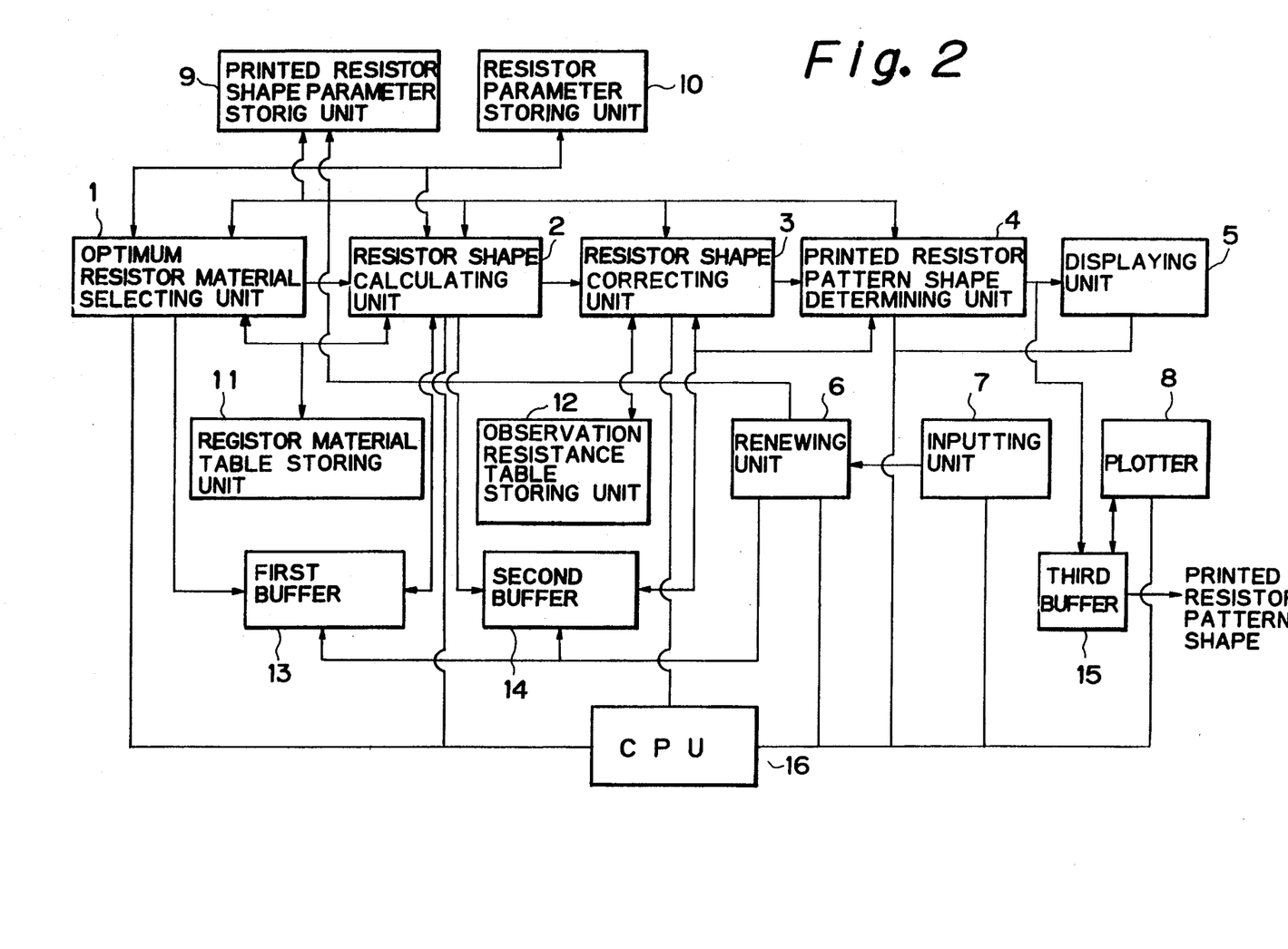
FIG. 2 is a block diagram of a CAD apparatus for designing a pattern as one embodiment of the present invention.

FIG. 2 is a block diagram of a CAD apparatus for designing a pattern of an electric circuit as one embodiment of the present invention.

In FIG. 2, the CAD apparatus is provided with an optimum resistor material selecting unit 1, a resistor shape calculating unit 2, a resistor shape correcting unit 3, a printed resistor pattern shape determining unit 4, a displaying unit 5, a renewing unit 6, an inputting unit 7, a plotter 8, a printed resistor shape parameter storing unit 9, a resistor parameter storing unit 10, a resistor material table storing unit 11, an observation resistance table storing unit 12, a first buffer 13, a second buffer 14, a third buffer 15 and a CPU (Central Processor Unit) 16.

The selecting unit 1 is adapted to select an optimum resistor material for a printed resistor to be designed, according to each value of a printed resistor shape parameter stored in the storing unit 9 and a resistor parameter stored in the storing unit 10, and the content of a resistor material table stored in the storing unit 11. The selecting unit 1 is also adapted to store thus selected optimum resistor material name into the first buffer 13.

The calculating unit 2 is adapted to calculate a resistor shape of a printed resistor to be designed, according to the optimum resistor material name selected by the selecting unit 1, each value of the printed resistor shape parameter and the resistor parameter, and the content of the resister material table. The calculating unit 2 is also adapted to store thus calculated value of the resistor shape data into the second buffer 14.

The correcting unit 3 is adapted to correct the value of the resistor shape data, which is calculated by the calculating unit 2, to be the value more suitable for the real forming condition of the printed resistor, according to the content of an observation resistance table stored in the storing unit 12, the optimum resistor material name, and the value of the printed resistor shape parameter. The correcting unit 3 is also adapted to renew the content of the second buffer 14 according to thus obtained corrected value.

The determining unit 4 is adapted to determine the printed resistor pattern shape and the electrode pattern shape on an assumption that the printed resistor made of the optimum resistor material is formed to be overlapped on the electrode at both ends (as shown in FIG. 1), according to the corrected value of the resistor shape data corrected by the correcting unit 3, and the value of the printed resistor shape parameter. The determined unit 4 is also adapted to store thus determined content of the printed resistor pattern shape and electrode pattern shape into the third buffer 15, and display thus determined content onto the displaying unit 5. The displaying unit 5 consists of a CRT (Cathode Ray Tube) display device, a LCD (Liquid Crystal Display) device, or an EL (Electroluminescence) display device, for example.

In this manner, by displaying the determined printed resistor pattern shape on the displaying unit 5, the CAD apparatus urges the designer to evaluate the determined printed resistor pattern shape.

The inputting unit 7 consists of a keyboard, a tablet device, or a mouse device, for example. The inputting unit 7 is adapted such that the value of the printed resistor shape parameter, the value of the resistor parameter, the content of the resistor material table, and the content of the observation resistance table, can be inputted via the inputting unit 7. The evaluation result of the printed resister pattern shape displayed on the displaying unit 5, is also inputted via the inputting unit 7 by the designer. Further, a new value of printed resistor shape parameter, a new optimum resistor material name, or a new value of resistor shape data, is inputted via the inputting unit 7 so as to change the printed resistor pattern shape, in case that the evaluation result is "negative", i.e. in case that the result is not satisfactory.

The renewing unit 6 is adapted to renew the content of the printed resistor shape parameter storing unit 9, the first buffer 13 and the second buffer 14, according to the new value of the printed resistor shape parameter, the new optimum resistor material name, or the new value of the resistor shape data, which is inputted via the inputting unit 7.

The plotter 8 is adapted to read out the printed resistor pattern shape, which is confirmed to be good as the "good" evaluation result is inputted via the inputting unit 7, from the third buffer 15, and output it onto a recording paper as a drawing.

The CPU 16 is adapted to control the selecting unit 1, the calculating unit 2, the correcting unit 3, the determining unit 4, the displaying unit 5, the renewing unit 8, the inputting unit 7 and the plotter 8, so as to perform the printed resistor pattern shape setting process, the drawing formation process and so on, in a manner described later in detail.

That is to say, the first buffer 13 serves as the optimum resistor material name storing unit, and the second buffer 14 serves as the resistor shape storing unit.

The printed resistor shape parameters to be stored in the storing unit 9, include a printed resistor minimum width Wmn, a printed resistor minimum length Lmn, a maximum aspect ratio Asmx, a minimum aspect ratio Asmn, an overlapped width OVR of the printed resistor and the electrode, an electrode shape M1, M2, a calculation resistance ratio Itg, a trimming ratio Tr, and a used electrode material name.

Here, the calculation resistance ratio Itg is a coefficient to make the estimation of the necessary resistance R of the printed resistor lower in advance, in order to take the trimming process (a fine adjustment of the resistance performed by cutting off the formed printed resistor) into consideration. The trimming ratio Tr is a ratio of the width, which can be trimmed, of the printed resistor to be designed, with respect to the effective resistor width W of the same.

The resistor parameters, which are stored in the resistor parameter storing unit 10, include the above-mentioned necessary resistance R and the consuming electric power P of the printed resistor.

Figure 3:
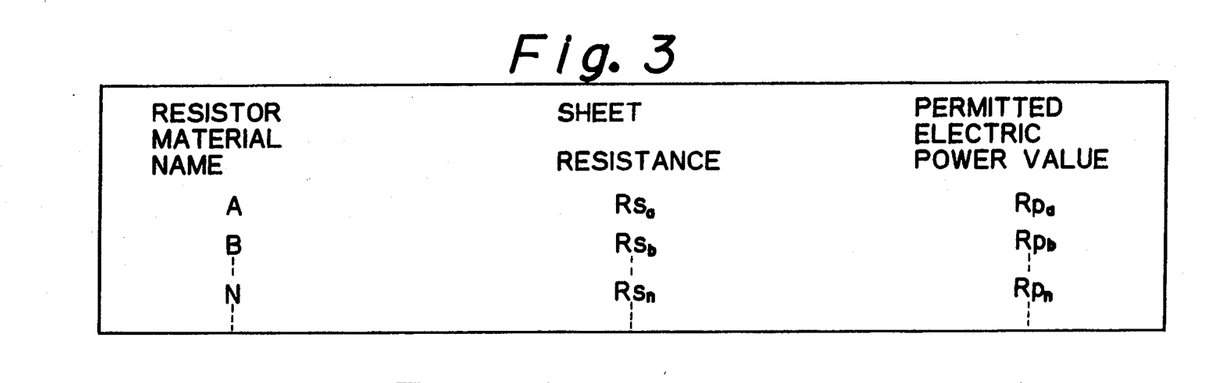
FIG. 3 is a schematic view showing one example of content of a resister material table in the CAD apparatus of FIG. 2.

The resistor material table stored in the storing unit 11, includes the names of various resistor materials, each sheet resistance Rs of each resistor material, each permitted electric power Pp of each resister material, correspondingly, as shown in FIG. 3, for example.

Figure 4:
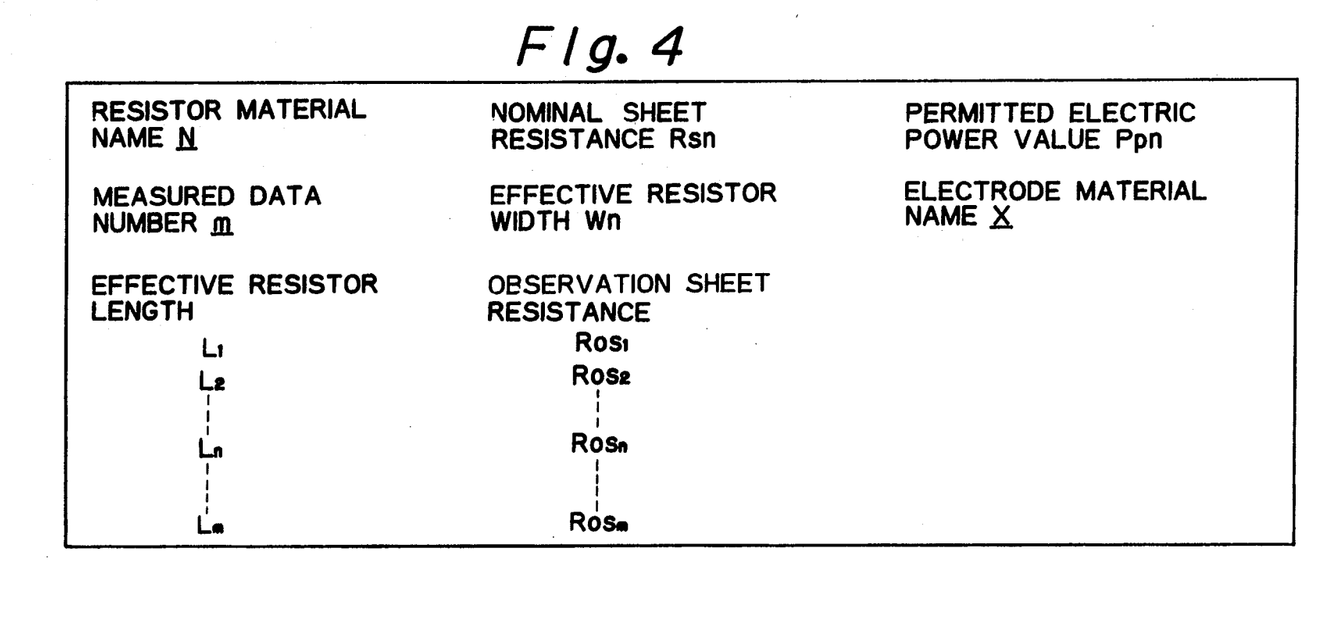
FIG. 4 is a schematic view showing one example of content of an observation resistance table in the CAD apparatus of FIG. 2.

The observation resistance table, which is stored in the storing unit 12, includes a plurality of sets of the values of the observation sheet resistances "Ros1, Ros2, ..., Rosn, ..." corresponding to the changing values of "L1, L2, ..., Ln, ..." of the effective resistor length L, per each group of the resistor material name n, the electrode material name X and the effective resistor width W, as shown in FIG. 4, for example.

Here, the observation sheet resistance Ros is actually such a value as following. Namely, it is the actually observed or measured value of the sheet resistance Rs, with respect to the various changing values "L1, L2, ..., Ln, ..." of the effective resistor length L of the printed resistor, which is formed in the pattern shape as shown in FIG. 1, with the condition that the resistor material of the resistor material name in the relevant observation resistance table to which the observation sheet resistance Ros is registered, is used for the printed resistor, and that the electrode material of the electrode material name in the relevant observation resistance table is used for the electrode, while the effective resistor width W in the relevant observation resistance table is adopted.

Accordingly, the change in resistance due to the contact resistance at the overlapped portion 19 between the printed resistor 17 and the electrode 18, as well as the printing blots at both ends of the printed resistor 17, are already considered and included in this observation sheet resistance Ros.

Figure 5:
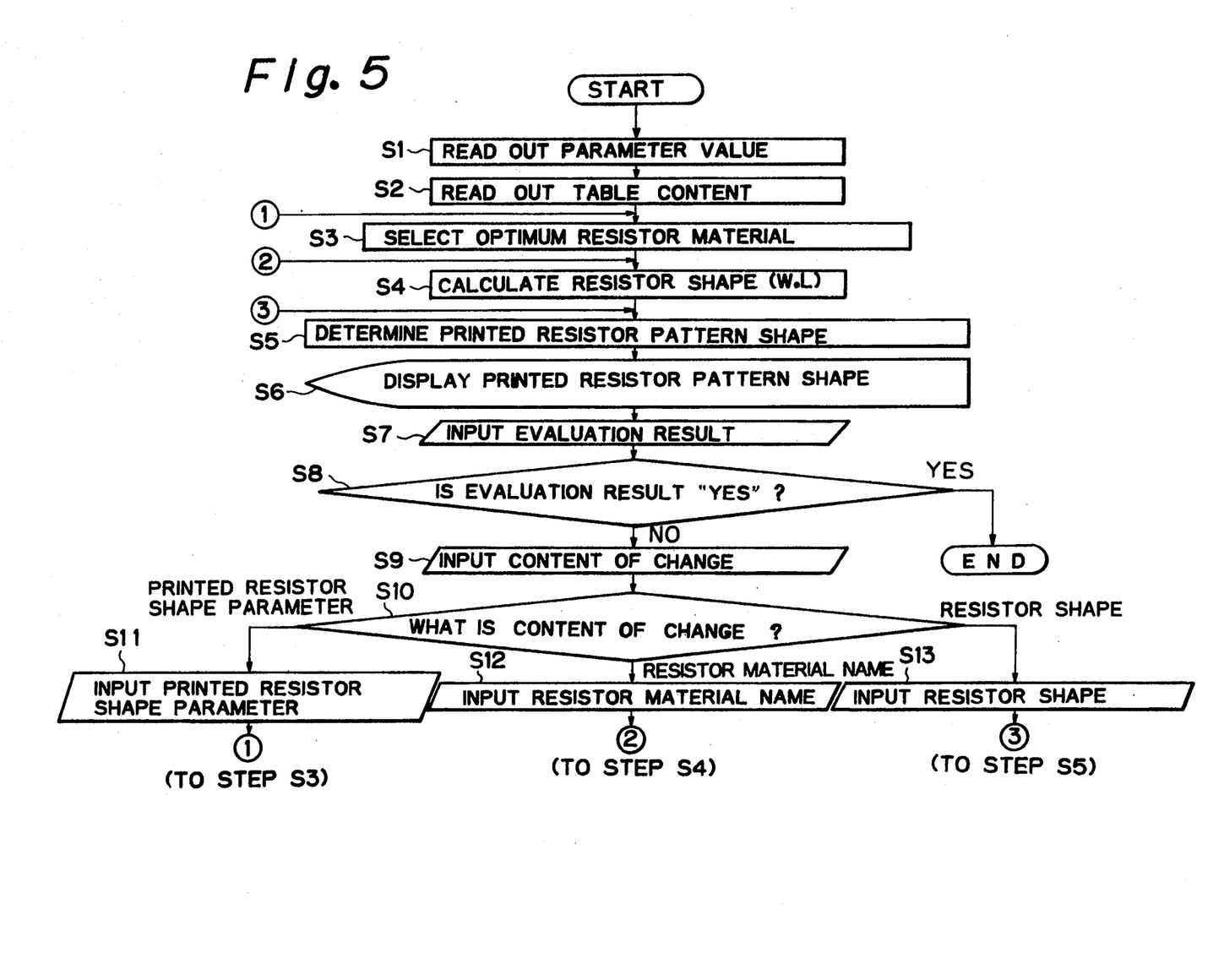
FIG. 5 is a flow chart showing an operation of printed resistor pattern shape setting process by the CAD apparatus of FIG. 2.

FIG. 5 is a flow chart showing an operation of printed resistor pattern shape setting process performed by the CAD apparatus constructed in the above-mentioned manner, under the control of the CPU 16. The operation of the CAD apparatus is hereinbelow explained in detail with referring to FIG. 5.

In FIG. 5, at the step S1, the values of the printed resistor shape parameters, which are inputted via the inputting unit 7 in advance and are stored in the printed resistor shape parameter storing unit 9, are read out. In the same manner, the values of the resistor parameters, which are stored in the resistor parameter storing unit 10, are read out.

At the step S2, the content of the resistor material table stored in the storing unit 11 and the content of the observation resistance table stored in the storing unit 12, are read out.

At the step S3, the optimum resistor material is selected by the selecting unit 1, according to the content of the resister material table read out in the step S2 and the values of the printed resistor shape parameters read out in the step S1.

This selecting operation by the selecting unit 1 is performed as following.

Namely, at first, each value "Asa, Asb, ..." of the aspect ratio As, of each resistor material A, B, ..., is calculated according to the aforementioned expression (1), by use of each sheet resistance "Rsa, Rsb, ..." of each resistor material A, B, ..., which is read out form the resistor material table, and the necessary resistance "R" of the printed resistor shape parameter. Then, thus calculated each value "Asa, Asb, ..." of the aspect value As, is checked if it has such a relationship that Asmn≦As≦Asmx, with respect to the values of the maximum aspect ratio Asmx and the minimum aspect ratio Asmn of the printed resistor shape parameters. Then, the resistor materials satisfying this relationship Asmn≦As≦Asmx, are judged to be the available resistor materials. Then, further, the resistor material, which has the value of aspect ratio As closest to "1", is selected as the optimum resistor material out of thus judged available materials.

The resistor material name of the optimum resistor material selected in this manner, is then stored into the first buffer 13.

At the step S4, the resistor shape is calculated by the calculating unit 2 and the correcting unit 3, according to the content of the resistor material table and the content of the observation resistance table read out at the step S2, and the values of the printed resistor shape parameters and the resistor parameters read out in the step S1.

This calculating operation by the resistor shape calculating unit 2 and the correcting unit 3 is performed as following.

Namely, at first, the value of the necessary minimum area Smn of the printed resistor, is calculated by the calculating unit 2, according to the following expression (5), by use of the value of the permitted electric power Pp of the optimum resistor material registered in the resistor material table and the value of the resistor consuming electric power P of the resistor parameter, and the value of the trimming ratio Tr of the printed resistor shape parameter.

$$Smn = 1/(1-Tr) \times P/Pp \qquad (5)$$

Next, the aspect ratio As of the printed resistor using the optimum resistor material before trimming, is calculated according to the following expression (6), by use of the necessary resistance R, the value of the calculation resistance ratio Itg of the printed resistor shape parameter, and the sheet resistance Rs of the optimum resistor material which is registered in the resistor material table.

$$As = Itg \times R/Rs \qquad (6)$$

Then, by use of thus calculated values of the necessary minimum area Smn and the aspect ratio As, the values of the effective resistor width W and the effective resistor length L, are calculated according to the aforementioned expressions (3) and (4). And then, it is checked if the calculated value of the effective resistor width W is not less than the resistor minimum width Wmn, and it is also checked if the calculated value of the effective resistor length L is not less than the resistor minimum length Lmn.

As a result of checking, if W<Wmn, the value of the effective resistor width W is changed to "Wmn", and the value of the effective resistor length L is calculated again according to the following expression (7).

$$L = As \times Wmn \qquad (7)$$

On the other hand, if L<Lmn, the value of the effective resistor length L is changed to "Lmn", and the value of the effective resistor width W is calculated again according to the following expression (8).

$$W = Lmn/As \tag{8}$$

In the above described manner, the resistor shape data consisting of the value of the effective resistor width W calculated according to the expression (3) or (8), and the value of the effective resistor length L calculated according to the expression (4) or (7), are stored into the second buffer 14.

After this calculating operation by the calculating unit 2, the calculated values of the resistor shape data of the printed resistor, are corrected by the correcting unit 3 to be more precisely matched with the actual formed condition of the printed resistor. This correcting operation is performed as following.

Namely, the observation resistance table, to which the electrode material name same as the used electrode material name of the printed resistor shape parameter is registered, and at the same time, to which the effective resistor width W closest to the calculated value of the effective resistor width W according to the expression (3) or (8) is registered, is selected out of a plurality of observation resistance tables, which have the registered resistor material name same as the optimum resistor material. And, then, the characteristic curve of the sheet resistance Rs with respect to the change of the effective resistor length L with a constant effective resistor width, is obtained by the approximation using the three dimensional expression as shown in FIG. 6, according to the changing values of various effective resistor lengths L registered in thus selected observation resistance table, and various observation sheet resistances Ros corresponding to this change of the effective resister length L.

Figure 6:
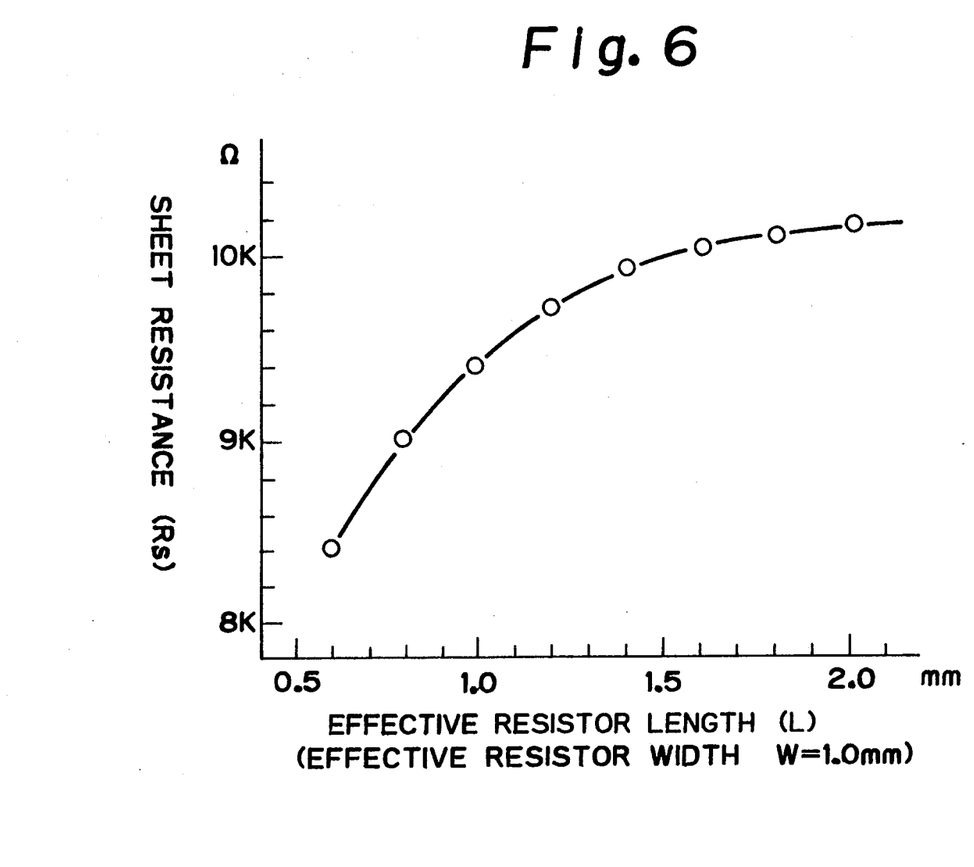
FIG. 6 is a graph showing one example of characteristic curve of a sheet resistance with respect to a change of a resistor length with a constant resistor width.

Next, the sheet resistance "Rso", which is closer to the observation value than the case of the effective resistor length L calculated by the expression (4) or (7), is obtained according to the characteristic curve of the sheet resistance change of FIG. 6. Then, by use of thus obtained sheet resistance "Rso", the corrected value "Aso" of the aspect ratio As, is calculated according to the aforementioned expression (6). After that, by use of thus calculated corrected value "Aso" of the aspect ratio As, either the corrected value of the effective resistor width W or the corrected value of the effective resistor length L, is calculated according to the expression (7) or (8).

In this manner, the content of the second buffer 14 is renewed by the corrected value of the effective resistor length L calculated by the expression (7) or the corrected value of the effective resistor width W calculated by the expression (8).

Accordingly, at this stage, thus obtained sheet resistance "Rso" already contains the contribution of the contact resistance of the overlapped portion 19 between the printed resistor 17 and the electrode 18, as well as the contribution of the resistance change due to the printing blots at both ends of the printed resistor 17 (FIG. 1). Accordingly, the resistor shape calculated according to this sheet resistance "Rso", is already corrected about the resistance change due to these contact resistance and printing dots. As a result, just by determining the printed resistor pattern shape on the basis of the resistor shape calculated in the above mentioned manner, the printed resistor pattern shape can be determined automatically and objectively without the necessity of the skill of the designer.

At the step S5, the printed resistor pattern shape and the electrode pattern shape are determined by the determining unit 4, according to the values of the resistor shape obtained at the step S4, and the value of the printed resistor shape parameter read out at the step S1.

The printed resistor pattern shape is determined as following.

Namely, the printed resistor width W0 and the printed resistor length L0 are calculated according to the following expressions (9) and (10), by use of the calculated values of the effective resistor width W and the effective resistor length L, and the value of the overlapped width OVR of the printed resistor shape parameter.

$$\text{printed resistor width } W0 = W \tag{9}$$

$$\text{printed resistor length } L0 = L + OVR \times 2 \tag{10}$$

In this manner, the printed resistor pattern shape consisting of the printed resistor length W0 and the printed resistor length L0, is determined.

In the same manner, the electrode width A and the electrode length B are calculated according to the expressions (11) and (12), by use of the value of the effective resistor width W, the value of the overlapped width OVR of the printed resistor shape parameter, and the values of the electrode shape M1, M2.

$$\text{electrode width } A = W + M1 \times 2 \tag{11}$$

$$\text{electrode length } B = OVR + M2 \tag{12}$$

In this manner, the electrode pattern shape consisting of the electrode width A and the electrode length B, is determined. Then, thus determined printed resistor pattern shape and electrode pattern shape, are stored into the third buffer 15.

At the step S6, the printed resistor pattern shape and the electrode pattern shape determined at the step S5, are displayed on the displaying unit 5.

At the step S7, it is judged by the designer, if the resistor material, the printed resistor pattern shape and the electrode pattern shape, are good or bad, according to these pattern shapes displayed on the displaying unit 5 at the step S6. As a result of this evaluation, if it is judged to be "good", the evaluation result "Yes" is inputted via the key board of the inputting unit 7 by the designer. On the other hand, if it is judged to be "negative" i.e. "bad", the evaluation result "No" is inputted via the key board.

At the step S8, it is judged if the inputted evaluation result is "Yes" or not. If it is "Yes", the values of the printed resistor pattern shape and the electrode pattern shape determined at the step S5, are decided as a final good result, and the operation of one consecutive setting process for the printed resistor pattern shape, is ended. On the other hand, if it is not judged to be "Yes" at the step S8, the flow branches to the step S9.

At the step S9, in order to change the values of the printed resistor pattern shape and the electrode pattern shape, the content of the necessary change is inputted via the mouse device or keyboard, etc., of the inputting unit 7, by the designer.

At the step S10, it is judged if the content of change inputted at the step S9, is a change for the printed resistor shape parameter, a change for the resistor material name, or a change for the resister shape.

If it is the change for the printed resistor shape parameter, the flow branches to the step S11. If it is the change for the resistor material name, the flow branches to the step S12. If it is the change for the resistor shape, the flow branches to the step S13.

At the step S11, a new value of the printed resistor shape parameter is inputted via the keyboard etc., of the inputting unit 7. Then, according to this inputted new value, the content of the printed resistor shape parameter storing unit 9 is renewed by the renewing unit 6. The values of the printed resistor shape parameters after renewing, are read out from the storing unit 9, and the flow goes back to the step S3. Then, the selection of the optimum resistor material, the calculation of the resistor shape, the correction of the resistor shape, the determination of the printed resistor pattern shape, and the display/evaluation of the obtained printed resistor pattern shape, are repeated.

At the step S12, a new optimum resistor material name is inputted via the inputting unit 7. Then, the content of the buffer 13 is renewed by the renewing unit 6 according to this inputted new optimum resistor material name. Then, the optimum resistor material name after renewing is read out from the first buffer 13, and the flow goes back to the step S4. Then, the calculation of the resistor shape, the correction of the resistor shape, the determination of the printed resistor pattern shape and the display/evaluation of the obtained printed resistor pattern shape, are repeated.

At the step S13, a new value of the resistor shape data is inputted via the inputting unit 7. Then, the content of the second buffer 14 is renewed by the renewing unit 6, according to this inputted new value of the resistor shape data. Then, the value of the resistor shape data after renewing, is read out from the second buffer 14, and the flow goes back to the step S5. Then, the determination of the printed resistor pattern shape and the display/evaluation of the determined printed resistor pattern shape are repeated.

In this manner, the redetermined content of the printed resistor pattern shape is evaluated at the steps S6 and S7. If the evaluation result is judged to be "Yes" at the step S8, the values of the printed resistor pattern shape and the electrode pattern shape redetermined at the step S5, are decided as the final good result, so that the content of the third buffer 15 is renewed. Then, the setting process operation of the printed resistor pattern shape, is ended.

After that, the wiring designing processes, such as an operation of outputting the decided printed resistor pattern shape and electrode pattern shape as a drawing on the recording sheet by the plotter 8 and so on, are continued.

As described above in detail, according to the present embodiment, the printed resistor shape parameters including the values of the printed resistor minimum width Wmn, the printed resistor minimum length Lmn, the maximum aspect ratio Asmx, the minimum aspect ratio Asmn, the overlapped width OVR, the electrode shape M1, M2, the calculation resistance ratio Itg, and the trimming ratio Tr, and the used electrode material, are stored in the printed resistor shape parameter storing unit 9, prior to the determination of the printed resistor pattern shape. The resistor parameters including the values of the necessary resistance R and the resistor consuming electric power P, are stored in the resistor parameter storing unit 10. The resistor material table including various resistor material names, the sheet resistance Ra and the permitted electric power value Pp of each corresponding resistor material, are stored in the resistor material table storing unit 11. Further, a plurality of sets of observation resistance tables, each including the observation sheet resistances Ros etc. corresponding to the changing values of the effective resistor length L, with respect to each resistor material name, each electrode name, and each effective resistor width W, are stored in the observation resistance table storing unit 12.

Accordingly, by reading out the printed resistor shape parameters, the resistor parameters, the content of the resistor material table and the content of the observation resistance table, as occasion demands, the present embodiment performs the determination of the printed resistor pattern shape, as following.

Namely, at first the optimum resistor material is selected by the selecting unit 1 according to the calculated aspect ratios As of various resistor materials. Then, the obtained optimum resistor material name is stored in the first buffer 13. Next, the resistor shape data consisting of the effective resistor width W and the effective resistor length L, are calculated by the calculating unit 2. Then, the calculated resistor shape data is stored in the second buffer 14. Further, the characteristic curve of the sheet resistance Rs with respect to the changing value of the effective resistor length L, is obtained by the correcting unit 3, according to the observation resistance table related to the set of selected optimum resistor material and the used electrode material which has the effective resistor width closest to the calculated effective resistor width W. Then, according to this characteristic curve, the corrected value of the resistor shape is calculated, and the content of the second buffer 14 is renewed with this corrected value. Finally, the determination of the printed resistor pattern shape and the electrode pattern shape, is performed by the determining unit 4, by use of the values of the resistor shape data stored in the second buffer 14.

After that, if the evaluation result by the designer is "bad", with respect to the printed resistor pattern shape and the electrode pattern shape displayed on the displaying unit 5, the designer inputs the evaluation result "No", and the new value of the printed resistor shape parameter, the new optimum resistor material name, or the new value of the resistor shape data via the inputting unit 7. Then, according to this inputted new value or name, the content of the printed resistor shape parameter storing unit 9, the content of the first buffer 13 or the content of the second buffer 14, is renewed by the renewing unit 6. Then, according to this renewed content, the determination and the evaluation of the printed resistor pattern shape are performed again by the selecting unit 1, the calculating unit 2, the correcting unit S and the determining unit 4.

Consequently, according to the present embodiment, the selection of the optimum resistor material, the calculation of the resistor shape, the correction of the resistor shape, the determination of the printed resistor pattern shape, and the correction of the printed resistor pattern shape can be automatically and objectively performed. In other word, regardless of the experience or skill of the designer, the efficiency, the standardization and the precision of the determining process of the printed resistor pattern shape, can be greatly improved.

In the above-mentioned embodiment, the observation sheet resistance Ros corresponding to the changing value of the effective resistor length L, is registered in the observation resistance table, the observation sheet resistance Ros corresponding to the changing value of the effective resistor width W, may be registered instead.

In the above-mentioned embodiment, the selection of the optimum resistor material, the calculation of the resistor shape, the correction of the resistor shape, the determination of the printed resistor pattern shape and the correction of the printed resistor pattern shape are all automatically performed. However, the present invention is not limited to this embodiment. For example, only the selection of the optimum resistor material, only the selection of the optimum resistor material and the calculation of the resistor shape, only the selection of the optimum resistor material, the calculation of the resistor shape, and the correction of the resistor shape, or only the selection of the optimum resistor material, the calculation (correction) of the resistor shape and the determination of the printed resistor pattern shape, may be automatically performed, while the remaining portion of the process may be performed manually.

Further, the algorithm of the present invention as for the selection of the optimum resistor material, the calculation of the resistor shape, the correction of the resistor shape, and the determination of the printed resistor pattern shape, is not limited to that of the above-mentioned embodiment.

Many widely different embodiments of the present invention may be constructed without departing from the spirit and scope of the present invention. It should be understood that the present invention is not limited to the specific embodiments described in this specification, except as defined in the appended claims.

What is claimed is:

1. A CAD apparatus for designing patterns of electric circuits, comprising:
   a printed resistor shape parameter storing unit for storing values of parameters including a maximum aspect ratio and a minimum aspect ratio of a printed resistor whose pattern is to be designed, and an electrode material to be used;
   a resistor parameter storing unit for storing values of parameters including a desired resistance and a resistor consuming electric power of said printed resistor whose pattern is to be designed;
   a resistor material table storing unit for storing a resistor material table including values of resistance per unit area and values of permitted electric power of various resistor materials;
   an optimum resistor material selecting unit for calculating aspect ratios of said various resistor materials according to a predetermined rule based on said values of resistance of said various materials stored in said resistor material table storing unit and said desired resistance stored in said resistor parameter storing unit and for selecting an optimum resistor material according to a predetermined rule based on the values of said calculated aspect ratios and values of said maximum and minimum aspect ratios stored in said printed resistor shape parameter storing unit;
   a calculating unit for calculating length and width of said printed resistor whose pattern is to be designed according to a predetermined rule based on said values of permitted electric power stored in said resistor material table storing unit, said values of resistor consuming electric power stored in said resistor parameter storing unit and said values of resistance per unit area stored in said resistor material table storing unit;
   an observation resistance table storing unit for storing an observation resistance table including values of observation resistance per unit area corresponding to a changing value of one of effective resistor width and effective resistor length for each of a plurality of sets of said resistor material and electrode material to be used, respectively; and
   a resistor shape correcting unit for calculating said resistance per unit area based on said values of observation resistance stored in said observation resistance table storing unit and for correcting said effective length and said effective width of said printed resistor based on said calculated value of resistance per unit area.

2. A CAD apparatus for designing a pattern according to claim 1, wherein said resistor shape correcting unit is designed for obtaining a characteristic curve of said observation resistance per unit area, under the condition that the other of said effective resistor width and said effective resistor length is set to be a constant value, according to a predetermined rule based on said observation resistance table related to the set of said optimum resistor material and said electrode material to be used, and for correcting said effective resistor width or said effective resistor length, according to a predetermined rule based on said characteristic curve, said desired resistance and the value of said calculated resistor shape.

3. A CAD apparatus for designing a pattern according to claim 2, wherein said printed resistor shape parameters further include an overlapped width, which indicates the width of an overlapped portion between said printed resistor and an electrode to be designed, and an electrode shape, which indicates a shape of said electrode,
   said CAD apparatus further comprising;
   a determining unit for determining a printed resistor pattern shape, which includes a printed resistor width and a printed resistor length, and an electrode pattern shape, which includes an electrode width and an electrode length, according to a predetermined rule based on the value of said resistor shape, the value of said overlapped width and the value of said electrode shape.

4. A CAD apparatus for designing a pattern according to claim 3, further comprising:
   a displaying unit for displaying said printed resistor pattern shape and said electrode pattern shape, which are determined by said determining unit;
   an inputting unit for inputting an evaluation result of said displayed printed resistor pattern shape and said displayed electrode pattern shape, and further inputting at least one of new values of said printed resistor shape parameter and said resistor shape, and a new name of said optimum resistor material, if said evaluation result is negative; and
   a renewing unit for renewing the content of said printed resistor shape parameter storing unit, said resistor shape storing unit or said optimum resistor material name storing unit, if said new value or said new name is inputted via said inputting unit,
   wherein at least one of the optimum resistor material selecting operation, the resistor shape calculating operation, the resistor shape correcting operation, and the printed resistor pattern shape determining operation, is performed again by said selecting unit, said calculating unit, said correcting unit, and said determining unit, on the basis of the contents of said printed resistor shape parameter storing unit, and said optimum resistor material name storing unit and said resistor shape storing unit, which are renewed by said renewing unit, if said new value or said new name is issued.

* * * * *